United States Patent [19]

Ishii

[11] 4,110,559
[45] Aug. 29, 1978

[54] LOUD-SPEAKER OUTPUT CIRCUIT

[75] Inventor: Kazuo Ishii, Tokyo, Japan

[73] Assignee: Tokyo Shibaura Electric Co., Ltd., Kawasaki, Japan

[21] Appl. No.: 794,341

[22] Filed: May 6, 1977

Related U.S. Application Data

[63] Continuation of Ser. No. 629,223, Nov. 6, 1975, abandoned.

[30] Foreign Application Priority Data

Nov. 7, 1974 [JP] Japan .................................. 49-127486

[51] Int. Cl.² .............................................. H03F 3/181
[52] U.S. Cl. .................................... 179/1 D; 179/1 A
[58] Field of Search ................................ 179/1 A, 1 D

[56] References Cited

U.S. PATENT DOCUMENTS 2,762,870  9/1956  Sziklai .................................. 179/171

OTHER PUBLICATIONS

H. Sams, "Photofact Schematic," 1959, p. 100.
ARRL, "Handbook," 1963, pp. 168, 170, 1972, p. 128.
F. Terman, "Radio Engineers Handbook,", 1943, pp. 126-128, 329, 330.

Primary Examiner—Kathleen H. Claffy
Assistant Examiner—E. S. Kemeny
Attorney, Agent, or Firm—Oblon, Fisher, Spivak, McClelland & Maier

[57] ABSTRACT

A very low noise audio output amplifier circuit features power supply bypass capacitors comprising an electrolytic capacitor in parallel with nonpolar capacitors from the group consisting of metallized paper (MP), polyethylene terephthalate (MYLAR), and polystyrene film capacitors.

2 Claims, 4 Drawing Figures

4,110,559

LOUD-SPEAKER OUTPUT CIRCUIT

This is a continuation of application Ser. No. 629,223, filed Nov. 6, 1975, now abandoned.

BACKGROUND OF THE INVENTION

1. Field of the Invention

This invention relates to a transistor amplifier circuit and more particularly to a loud-speaker output circuit capable of producing audio signals with a high degree of fidelity.

2. Description of the Prior Art

A audio frequency amplifier for amplifying sound signals representing, for example, voices or musical tones is demanded to carry out said amplification without distortion. The high fidelity amplification of the audio frequency amplifier is supposedly obstructed by the amplitude distortion phase distortion or inter modulation distortion of sound signals resulting from the nonlinear characteristic of an active element such as a vacuum tube or transistor.

Hitherto, various attempts have been made to minimize said nonlinear characteristic. However, any attempt made to date failed to attain the satisfactorily fidelity amplification of the audio frequency amplifier. Particularly, the transistor amplifier was generally found to carry out less fidelity amplification than the vacuum tube amplifier. Though several explanations have been proposed regarding the different degrees of fidelity in amplification between the vacuum tube and transistor amplifier, yet the factor has not been clearly defined. The above-mentioned case is supposed to arise from the fact that the transistor has a lower input impedance than the vacuum tube. Therefore, an amplifier using a field effect transistor having a high input impedance was put to practical application for trial. Yet, this type of amplifier failed to be fully improved in the fidelity of amplification.

BRIEF SUMMARY OF THE INVENTION

It is accordingly the object of this invention to provide a loud-speaker output circuit capable of carrying out reproduction with a high degree of fidelity.

The present inventor supposed in accomplishing this invention that the cause of the failure of a loud-speaker output circuit to be improved in fidelity of reproduction beyond a certain extent originated with the property of a transistor amplifier included in said output circuit. Based on this assumption, the inventor studied the properties of the constituent elements of the transistor amplifier, and found that an electrolytic condenser or capacitor practically connected to said amplifier had a considerable effect on the degree of fidelity with which audio signals could be amplified. As the result of this fact, the inventor connected in parallel said electrolytic capacitor to a plurality of parallel connected nonpolar capacitors each of which had such a small capacitance (for example, 0.01 to 100 microfarads) as little affected the capacitance of the electrolytic capacitor (for example, 5,000 to 20,000 microfarads), but was sufficiently large to allow the passage of signals having frequencies falling within the audible range, and which had mutually different inner loss-frequency characteristics. This arrangement was experimentally found prominently to improve that fidelity with which the sound signals are reproduced. However, the principle by which said improvement is attained has not yet been fully clarified theoretically.

It is known that inner loss of the electrolytic capacitance wherein a dielectric loss tan $\delta$, electrode loss and so on are included, more noticeably varies with the frequency of sound signals supplied to said electrolytic capacitor than that of the nonpolar capacitor. However, nothing is known about what effect is exerted on sound signals supplied to the audio frequency amplifier circuit by the nonlinearity of the inner loss of the capacitor relative to the audio frequency of said sound signals. Nor is given any report on the studies conducted from this point of view on the degree of fidelity with which the audio frequency amplifier amplifies sound signals. Therefore, the reason why the nonpolar capacitors parallel-connected to the electrolytic capacitor according to this invention can effectively improve the fideltiy of reproduction is not theoretically clear. However, the inventor has assumed that parallel connectin of nonpolar capacitors to the electrolytic capacitors enables the inner loss-frequency characteristics of the capacitors collectively to present linearity over a broad frequency range including the audio frequencies of sound signals practically used.

Considering that the inner loss of any type of capacitor is a function of the resistance component and reactance component of said capacitor, variation of said inner loss with the frequency of sound signals used is assumed to result from variation of the impedance of the capacitor with said frequency. Therefore, the electrolytic capacitor used with the audio frequency amplifier circuit is considered as a nonlinear element.

As discovered by this inventor, therefore, when a plurality of nonpolar capacitors which little affect the capacity of the electrolytic capacitor as nonlinear element in respect of static capacity and display different frequency characteristics relative to an inner loss connected in parallel to said electrolytic capacitors, then their linearity is improved, thereby providing a loud-speaker output circuit capable of reproducing sound signals with a high degree of fidelity.

This invention can be more fully understood from the following detailed description when taken in conjunction with the accompanying drawings,

DESCRIPTION OF THE PREFERRED EMBODIMENTS

Figure 1:
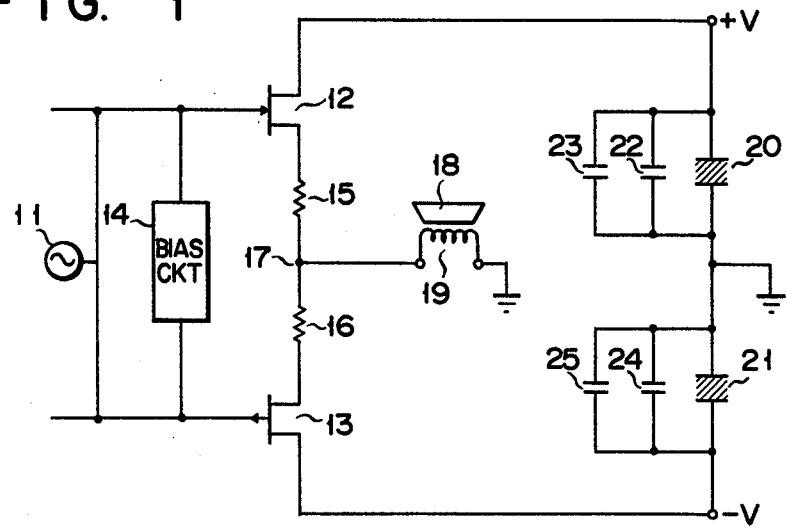
FIG. 1 represents an embodiment of this invention, schematically showing a loud-speaker output circit using field effect transistors.

Referring now to the drawings, wherein like reference numerals designate identical or corresponding parts, and more particularly to FIG. 1 thereof, sound audio signals delivered from sound signal source 11 such as amplifier are supplied to the input gate electrodes of a pair of complementary field effect transistors 12, 13 (hereinafter abbreviated as "FET"). The gate electrodes of these FET's 12, 13 are biased for the B class amplification by bias circuit 14. The source electrodes of the FET's 12, 13 are connected together through the corresponding resistors 15, 16. The drain electrode of the FET 12 is connected to the positive terminal +V of a D.C. source V. The drain electrode of the FET 13 is connected to the negative terminal −V of the D.C. source. The D.C. source V consists of an ordinary power supply circuit which provides direct current by rectifying commercially available A.C. power. The junction 17 of the resistors 15, 16 is connected to a referential potential point, for example, a ground point through the drive coil or the voice coil 19 of a loud-speaker 18. Sound signals brought to said junction 17 are reproduced in the form of tones by the loud-speaker 18. The electrolytic capacitors 20, 21 are connected between the positive and negative terminals +V, −V of the D.C. source and the ground point. These electrolytic capacitors 20, 21 are used as filters for the D.C. source and also for decoupling, and formed of an aluminium film generally having a capacitance of 5,000 to 20,000 microfarads. To the electrolytic capacitor 20 is connected in parallel a pair of parallel connected first and second nonpolar capacitors 22, 23, and to the electrolytic capacitor 21 is connected in parallel a pair of parallel connected first and second nonpolar capacitors 24, 25. These nonpolar capacitors 22, 23, 24, 25 are each chosen to have such a capacitance as little affects the capacitances of the electrolytic capacitors 20, 21, but is sufficiently large to allow sound signals having audible frequencies to pass therethrough. The first nonpolar capacitors 22, 24 are of a metallized paper (MP) type having a capacitance of, for example, 10 to 100 microfarads. The second nonpolar capacitors 23, 25 are formed of a film of polyethylene terephthalate (manufactured by E. I. du Pont de Nemours & Co., Inc. under the trademark "Mylar") and have a capacitance of, for example, 1 to 10 microfarads.

The electrolytic capacitors 20, 21 have an inner loss including loss tan δ, electrode loss and so on, which nonlinearly varies with the frequency of sound signals and sharply increases in the high frequency region. To prevent such undesirable occurrence, the loud-speaker output circuit is provided with the first and second nonpolar capacitors 22-24, 23-25 which are also of a nonlinear type but are subject to a relatively smaller inner loss than the electrolytic capacitors 20, 21 even in the high frequency region and further present slightly different inner loss-frequency characteristics from each other.

Figure 2:
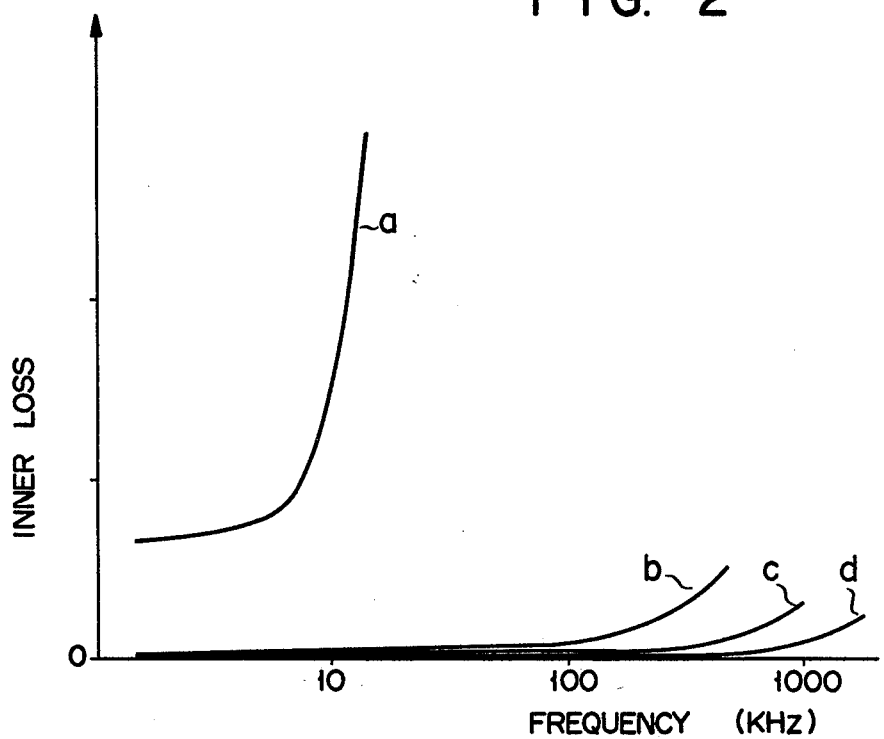
FIG. 2 is a curve diagram indicating the inner loss-frequency characteristics of an electrolytic capacitor and various nonpolar capacitors.

FIG. 2 shows the different degrees of inner loss of the electrolytic capacitor and nonpolar capacitors. The curve (a) represents an aluminium electrolytic capacitor, curve (b) an MP nonpolar capacitor, curve (c) a Mylar nonpolar capacitor and curve (d) a polystyrene film nonpolar capacitor. It is seen from FIG. 2 that if various types of nonpolar capacitor are connected in parallel to the electrolytic capacitors, then the inner loss-frequency characteristics of all these capacitors can collectively present the desired linearity over the range extending from the low to the high frequency level. The nonpolar capacitor is known to have an appreciably smaller inner loss than the electrolytic capacitor.

With the loud-speaker output circuit of this invention, therefore, sound signals are considerably saved from distortion, because the inner loss characteristics of the electrolytic and nonpolar capacitors can collectively rendered linear over a broad frequency range, and consequently are considerably saved from various forms of distortion.

Figure 3:
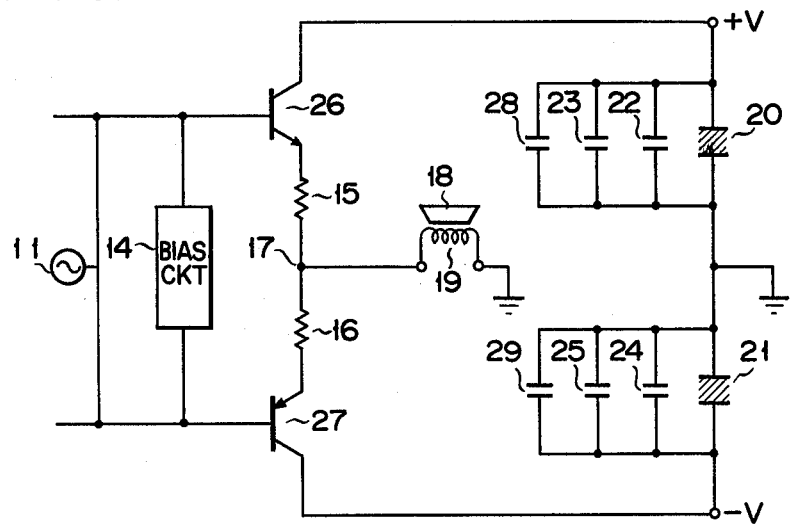
FIG. 3 denotes another embodiment of the invention, schematically illustrating a loud-speaker output circuit using bipolar transistors.

Referring to FIG. 3 showing another embodiment of this invention, the FET's included in the loud-speaker output circuit of FIG. 1 are replaced by complementary bipolar transistors 26, 27. The emitters of transistors 26, 27 are connected to the junction 17 of said bipolar transistors 26, 27 through the corresponding resistors 15, 16. The collectors of the transistors 26, 27 are respectively connected to the positive and negative terminals +V, −V of a D.C. source. The electrolytic capacitor 20 has a third nonpolar capcitor 28 connected in parallel to the first and second nonpolar capacitors 22, 23. Similarly an electrolytic capacitor 21 has a third nonpolar capacitor 29 connected in parallel to the first and second nonpolar capacitors 24, 25. The third nonpolar capacitors 28, 29 are formed of a polystyrene film having a capacitance of 0.01 to 0.5 microfarads and present different inner loss-frequency characteristics from the first and second nonpolar capacitors 22-24, 23-25. That is to say the first, second and third capacitors having the different capacitances of 10 to 100 microfarads, 1 to 10 microfarads and 0.01 to 0.5 microfarads have different inner losses corresponding to the different capacitances, respectively, as is obvious from the curves b, c and d in FIG. 2.

Figure 4:
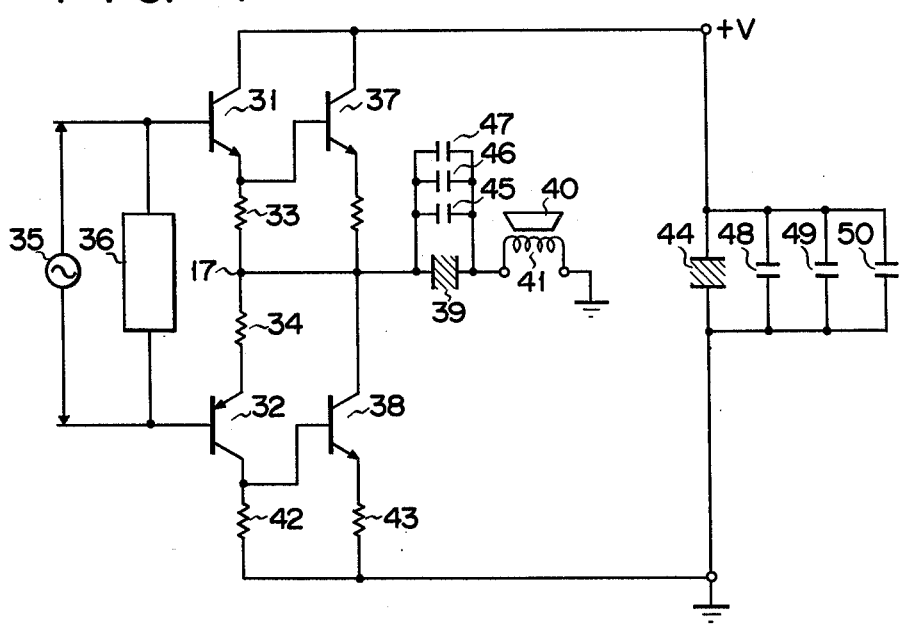
FIG. 4 shows still another embodiment of the invention, schematically presenting a loud-speaker output circuit in which a loud-speaker is connected to a transistor output circuit through an electrolytic capacitor.

Referring to FIG. 4 representing still another embodiment of this invention, the emitters of complementary transistors 31, 32 included in the loud-speaker output circuit are connected to their junction 17 through the corresponding resistors 33, 34. The input base electrodes of said complementary transistors 31, 32 are connected to a sound signal source 35 and bias circuit 36, thus forming the drive stage of the loud-speaker output circuit. Output signals from the emitter of the complementary transistor 31 and the collector of the complementary transistor 32 are respectively supplied to the bases of power transistors 37, 38 constituting a power stage. An amplified output signal from said power stage is conducted from the collector of the power transistor 38 through a first electrolytic capacitor 39 for coupling audio signals to the drive coil 41 of a loud-speaker 40. The collectors of the complementary transistor 31 and power transistor 37 are connected to the positive terminal +V of the D.C. source. The collector of the complementary transistor 32 and the emitter of the power transistor 38 are connected to a referential potential point, for example, a ground point through the corresponding resistors 42, 43. Connected between the positive terminal +V of the D.C. source and ground terminal is a second electrolytic capacitor 44 used as a power source filter as well as for decoupling.

The first electrolytic capacitor 39 is connected in parallel to three parallel-connected nonpolar capacitors 45, 46, 47 displaying different inner loss-frequency characteristics. The second electrolytic capacitor 44 is connected in parallel to three parallel-connected nonpolar capacitors 48, 49, 50 presenting different inner loss-frequency characteristics.

With the loud-speaker output circuit of this invention, each electrolytic capacitor included in the transistor amplifier circuit through which audio signals pass is provided, as mentioned above, with a plurality of parallel connected nonpolar capacitors displaying different inner loss characteristics. Therefore, the inner loss-frequency characteristic of the electrolytic capacitor is, so to speak, compensated by the different inner loss-frequency characteristics of the associated nonpolar capacitors, and consequently is rendered linear over a broad frequency range, thereby saving the transistor amplifier circuit from various forms of distortion.

All the foregoing embodiments refer to the case where each electrolytic capacitor was provided with two or three parallel connected nonpolar capacitors. However, more than three nonpolar capacitors may be used, if necessary. Further, the nonpolar capacitors are not subject to limitation in capacity and kind, provided they display different inner loss-frequency characteristics. It will be noted, however, that said nonpolar capacitors should be chosen to have such a small capacity as little affects the capacity of the electrolytic capacitor, but is sufficiently large to allow the passage of signals having frequencies falling within the audible range. Obviously, numerous modifications and variations of the present invention are possible in light of the above teachings. It is therefore to be understood that within the scope of the appended claims, the invention may be practiced otherwise than as specifically described herein.

What is claimed is:

1. A very low noise loud-speaker output circuit comprising:

a loud-speaker circuit means for driving a loud-speaker;

a transistor series circuit including at least one pair of series connected transistors connected in parallel to said loud-speaker circuit;

a sound signal source for delivering audio frequency signals to input electrodes of said transistors;

a bias circuit connected to said transistors;

at least one electrolytic capacitor having input and output terminals and connected between said transistor series circuit and a reference potential point, said electrolytic capacitor having a non-linear, frequency dependent inner loss characteristic whereby the fidelity of said loud-speaker output circuit is reduced in the audio frequency range; and, nonpolar capacitor means taken from the group consisting of metallized paper, polyethylene terephthalate and polystyrene film capacitors connected directly across said input and output terminals and in parallel with said electrolytic capacitor, said nonpolar capacitor means having a capacitance which is small relative to that of said electrolytic capacitor but which is sufficiently large to allow passage of signals having desired frequencies falling within the audible range, and including inner loss sufficiently smaller than that of said electrolytic capacitor for collectively providing an inner loss frequency characteristic which improves the fidelity of said loud-speaker output circuit.

2. A loud-speaker circuit as in claim 1, wherein said nonpolar capacitor means comprises:

at least two capacitor elements, each having progressively smaller values of capacitance and progressively smaller inner loss characteristics;

said two capacitor elements having capacitances sufficiently large to pass audio frequency signals; and said inner loss characteristics of said two capacitor elements combined with that of said electrolytic capacitor collectively acting to improve linearity of said loud-speaker output circuit.

* * * * *